(12) United States Patent
Kanamoto et al.

(10) Patent No.: US 7,582,908 B2
(45) Date of Patent: Sep. 1, 2009

(54) NITRIDE SEMICONDUCTOR DEVICE AND MANUFACTURING METHOD THEREOF

(75) Inventors: Kyozo Kanamoto, Tokyo (JP);
Katsuomi Shiozawa, Tokyo (JP);
Kazushige Kawasaki, Tokyo (JP);
Hitoshi Sakuma, Tokyo (JP); Yoshiyuki Suehiro, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 106 days.

(21) Appl. No.: 11/691,049

(22) Filed: Mar. 26, 2007

(65) Prior Publication Data

US 2007/0231978 A1    Oct. 4, 2007

(30) Foreign Application Priority Data

Mar. 30, 2006    (JP) .............................. 2006-093399

(51) Int. Cl.
*H01L 29/26* (2006.01)
(52) U.S. Cl. .......................................... 257/80; 438/22
(58) Field of Classification Search .................. 257/80; 438/22
See application file for complete search history.

(56) References Cited

U.S. PATENT DOCUMENTS 6,242,761 B1 * 6/2001 Fujimoto et al. .............. 257/94

6,281,526 B1 * 8/2001 Nitta et al. .................. 257/103
2007/0231978 A1 10/2007 Kanamoto et al.

FOREIGN PATENT DOCUMENTS

| JP | 2967743 | 8/1999 |
|----|---------|--------|
| JP | 2003-347660 | 12/2003 |
| JP | 2004-6718 | 1/2004 |
| JP | 2005-268769 | 9/2005 |

OTHER PUBLICATIONS

U.S. Appl. No. 11/691,049, filed Mar. 26, 2007, Kanamoto, et al.
U.S. Appl. No. 11/681,235, filed Mar. 2, 2007, Shiozawa, et al.
U.S. Appl. No. 11/844,707, filed Aug. 24, 2007, Shiozawa, et al.

* cited by examiner

*Primary Examiner*—Douglas M Menz
(74) *Attorney, Agent, or Firm*—Oblon, Spivak, McClelland, Maier & Neustadt, P.C.

(57) ABSTRACT

A nitride semiconductor device and its manufacturing method are provided which are capable of achieving low-resistance ohmic properties and high adhesion. A nitride semiconductor device has an n-type GaN substrate over which a semiconductor element is formed and an n-electrode as a metal electrode formed over the back surface of the GaN substrate. A surface denatured layer functioning as a carrier supply layer is provided between the GaN substrate and the n-electrode. The surface denatured layer is formed by denaturing the back surface of the GaN substrate by causing it to react with a material that contains silicon.

17 Claims, 4 Drawing Sheets

NITRIDE SEMICONDUCTOR DEVICE AND MANUFACTURING METHOD THEREOF

BACKGROUND OF THE INVENTION

1. Field of the Invention

The present invention relates to a nitride semiconductor device and a manufacturing method thereof, and particularly to a nitride semiconductor device having an n-electrode provided over the back surface of a nitride semiconductor substrate and a manufacturing method thereof.

2. Description of the Background Art

Methods of fabricating electrodes on nitride semiconductor substrates made of, e.g. GaN, are disclosed in Japanese Patent Publication No. 2967743 and Japanese Patent Application Laid-Open Nos. 2003-347660, 2004-6718 and 2005-268769 (hereinafter referred to respectively as Patent Documents 1 to 4), for example, in which the substrate is polished, further subjected to dry-etching for removal of polishing defects, or further subjected to oxygen plasma treatment. In the manufacturing method disclosed in Patent Document 4, a doping process is intentionally applied during the dry-etching.

However, such conventional manufacturing methods are incapable of offering both of satisfactory ohmic properties and satisfactory adhesion. That is, in such methods, low-resistance ohmic properties cannot be obtained without application of high-temperature thermal treatment after the deposition of electrodes, or low-resistance ohmic properties can be obtained without thermal treatment but the resistance is undesirably increased by thermal treatment that is required for the device assembly process, or low-resistance ohmic properties can be obtained but sufficient adhesion cannot be obtained.

That is, the application of high-temperature thermal treatment may deteriorate electric characteristics of the device structure previously formed on the front side. Also, the variations of electric characteristics caused by thermal treatment during device assembly process may be avoided by assembling at low temperatures, but the characteristics might be varied with time after the assembly because of, e.g., the heat generated during operation. Also, improved adhesion may be obtained by designing specific electrode structures or by applying acid treatment to the surface, but it will impose restrictions on the processes or deteriorate the low resistance achieved by some means.

SUMMARY OF THE INVENTION

An object of the present invention is to provide a nitride semiconductor device and its manufacturing method which are capable of achieving low-resistance ohmic properties and high adhesion.

According to a first aspect of the present invention, a nitride semiconductor device includes a nitride semiconductor substrate, a layered-structure of a nitride semiconductor element, a metal electrode, and a surface denatured layer that contains Si. The layered-structure of a nitride semiconductor element is provided on a first main surface side of the nitride semiconductor substrate. The metal electrode is provided on a second main surface side of the nitride semiconductor substrate. The Si-containing surface denatured layer is provided between the nitride semiconductor substrate and the metal electrode, and the surface denatured layer is formed by denaturing the second main surface of the nitride semiconductor substrate by causing the second main surface to react with a first material that contains Si.

It is possible to achieve low-resistance ohmic properties and high adhesion between the nitride semiconductor substrate and the metal electrode layer.

According to a second aspect of the present invention, a nitride semiconductor device manufacturing method includes a layered-structure forming step, a denatured layer forming step, and an electrode forming step. The layered-structure forming step forms a layered-structure of a nitride semiconductor element on a first main surface of a nitride semiconductor substrate. The denatured layer forming step forms a surface denatured layer that contains Si on a second main surface of the nitride semiconductor substrate by denaturing the second main surface of the nitride semiconductor substrate by causing the second main surface to react with a first material that contains Si. The electrode forming step forms a metal electrode on the surface denatured layer.

It is possible to achieve low-resistance ohmic properties and high adhesion between the nitride semiconductor substrate and the metal electrode layer.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
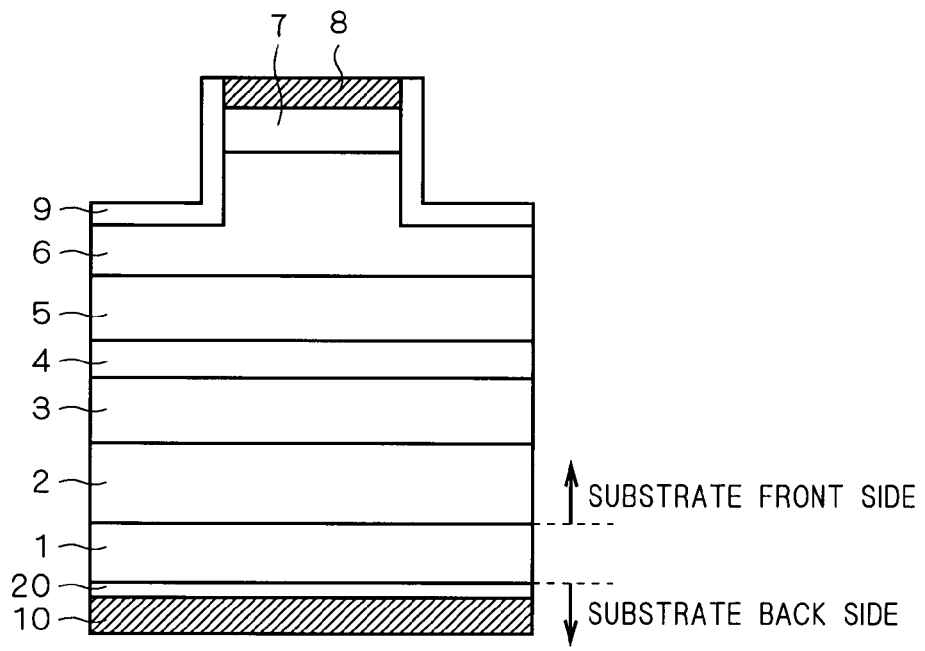
FIG. 1 is a diagram showing an example of the structure of a nitride semiconductor device according to a first preferred embodiment.

While doing research about treatments applied to substrate surfaces prior to the deposition of electrodes, we reached a mechanism that the outermost surface of the substrate is denatured in some way by the reaction with oxygen plasma or Si-containing plasma, and it generates carriers and thus allows formation of low-resistance electrodes. That is, a surface denatured layer (a carrier supply layer) that at least contains silicon, or silicon and oxygen, is formed between an n-type nitride semiconductor substrate and a metal electrode, and the electrode is formed without damaging the surface denatured layer during the process. The surface denatured layer is formed by performing a dry-etching process with a gas that contains a Si-containing plasma, and a surface treatment with an oxygen plasma. Now, referring to the drawings, the preferred embodiments of the present invention will be described in detail below. In the description about the sides of a substrate, the word "surface" will be used to indicate the surface that is opposite to the back surface, and also to indicate a region of the substrate including a surface and a very shallow portion from the surface.

First Preferred Embodiment

FIG. 1 is a diagram showing an example of the structure of a laser diode as a nitride semiconductor device according to a first preferred embodiment of the present invention. As shown in FIG. 1, the semiconductor device uses an n-type GaN substrate 1 as the nitride semiconductor substrate.

On the front surface side (a first main surface side), or the Ga surface, of the GaN substrate 1, an n-type AlGaN cladding layer 2, an n-type GaN guide layer 3, an active layer 4, a p-type GaN guide layer 5, a p-type AlGaN cladding layer 6, and a p-type GaN contact layer 7 are formed as a layered-structure of nitride semiconductors, and the GaN substrate 1 and the layered-structure form a laser diode element (a nitride semiconductor element). A p-electrode 8 is formed on the p-type GaN contact layer 7. The p-type AlGaN cladding layer 6 and the p-type GaN contact layer 7 are patterned in a given shape by etching. The p-electrode 8 is disposed on top of the p-type GaN contact layer 7. Also, an $SiO_2$ film 9, serving as an insulating protective film, is formed to cover the upper part of the nitride semiconductor device, with the top surface of the p-electrode 8 exposed.

An n-electrode 10 is formed as a metal electrode on the back surface side (a second main surface side), or the N surface, of the GaN substrate 1. In this preferred embodiment, a surface denatured layer 20, functioning as a carrier supply layer, is provided between the n-electrode 10 and the GaN substrate 1. As will be described later, the surface denatured layer 20 is formed by denaturing the back surface of the GaN substrate 1 by causing it to react with a material that contains silicon (a first material).

Figure 2:
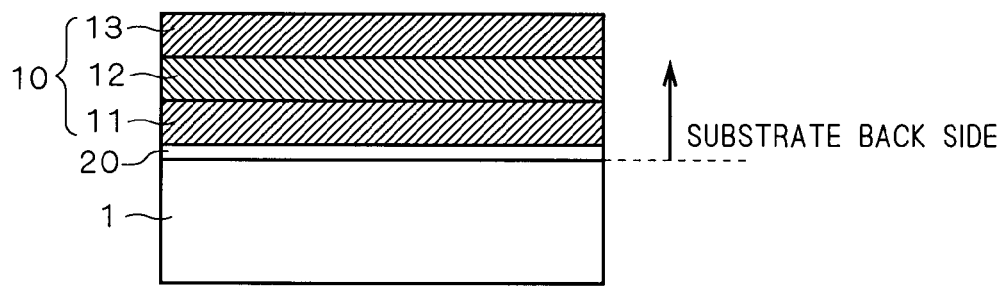
FIG. 2 is an enlarged cross-sectional view showing the back surface side of the substrate of the nitride semiconductor device of the first preferred embodiment.

FIG. 2 is an enlarged cross-sectional view showing the back surface side of the GaN substrate 1 of the nitride semiconductor device shown in FIG. 1. FIG. 2 shows the GaN substrate 1 with its back surface facing up, i.e., the GaN substrate 1 of FIG. 1 is turned upside down in FIG. 2.

As mentioned above, the surface denatured layer 20 lies between the back surface of the GaN substrate 1 and the n-electrode 10. The n-electrode 10 has a three-layered structure including a Ti film 11, a Pt film 12, and an Au film 13, and the Ti film 11 forms the surface that connects with the surface denatured layer 20. This reduces the Schottky barrier between the n-electrode 10 and the GaN substrate 1, and offers good, low-resistance ohmic properties.

Figure 3:
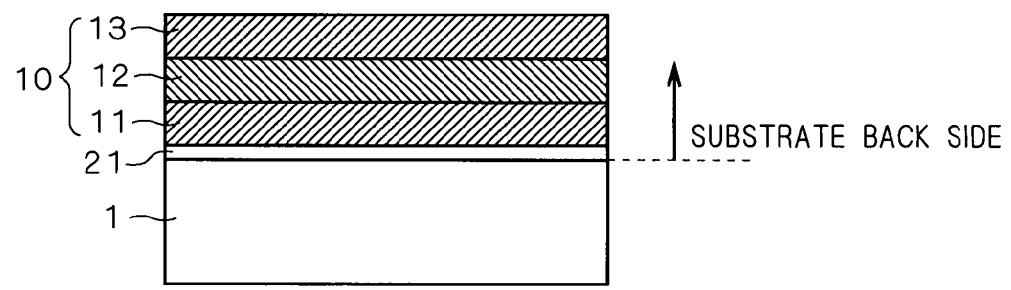
FIG. 3 is an enlarged cross-sectional view showing the back surface side of a substrate of a nitride semiconductor device for comparison.

FIG. 3 is a cross-sectional view showing a laser diode for comparison, which, as disclosed in Patent Document 1 etc., has a high-concentration doped layer 21 formed on the back surface of the GaN substrate 1, in place of the surface denatured layer 20 of this preferred embodiment. The high-concentration doped layer 21 is formed relatively thick on the back surface of the GaN substrate 1 with a Si-containing gas plasma. The surface denatured layer 20 of the laser diode of the preferred embodiment shown in FIG. 2 differs from the high-concentration doped layer 21 of FIG. 3 in that the surface denatured layer 20 is formed by denaturing the outermost surface of the GaN substrate 1 or an extremely thin region of the GaN substrate 1 including only one or two layers (a depth corresponding to about one or two atoms from the outermost surface).

FIGS. 4 to 8 are process diagrams illustrating a process of manufacturing the nitride semiconductor device of this preferred embodiment, and the diagrams particularly show the process steps for forming the electrode structure on the back side of the GaN substrate 1 shown in FIG. 2. The process of forming the n-type AlGaN cladding layer 2, the n-type GaN guide layer 3, the active layer 4, the p-type GaN guide layer 5, the p-type AlGaN cladding layer 6, the p-type GaN contact layer 7, the p-electrode 8, and the $SiO_2$ film 9 over the front surface of the GaN substrate 1 shown in FIG. 1 is not described in detail herein, because they can be formed by conventional methods (for example, methods disclosed in Patent Documents 1 to 4).

Figure 4:
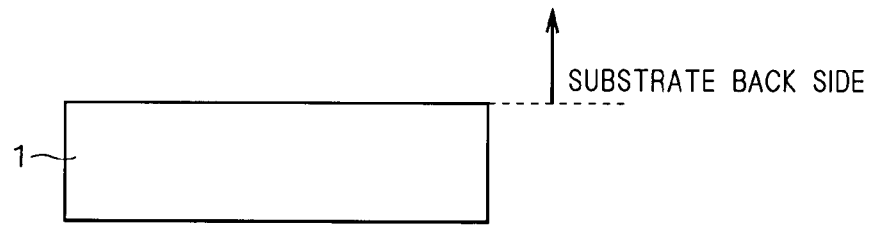
FIGS. 4 to 9 are process diagrams illustrating a method of manufacturing the nitride semiconductor device of the first preferred embodiment.

In the process of manufacturing the nitride semiconductor device of this preferred embodiment, given pretreatment processes are applied to the back surface of the GaN substrate 1, prior to the formation of the n-electrode 10 (FIG. 4). The pretreatment processes include polishing and grinding for thinning of the GaN substrate 1, a plasma treatment for forming the surface denatured layer 20 that supplies high-concentration carriers in the back surface of the GaN substrate 1, and an oxygen plasma treatment for removing surface contaminants to enhance the adhesion and for enhancing the carrier supply capability.

For a specific example of the grinding and polishing process, the back surface of the GaN substrate 1 is first ground by about 200 to 300 μm with a grinding machine, next the ground surface is made flat with diamond slurry, and then it is polished with abrasive cloth using diamond slurry as abrasive, for example. The last polishing process is achieved by mechanical polishing without using chemical etching, by using a neutral or weak-alkaline (with a pH of 8.5 or less) diamond slurry having a particle size of 0.4 μm or more. It is then possible to intentionally leave roughness by polishing on the back surface of the GaN substrate 1, whereby the GaN substrate 1 has a rough back surface even after the next plasma treatment. This enlarges the area of the back surface of the GaN substrate 1.

The plasma treatment may utilize dry-etching by Inductively Coupled Plasma (ICP), Reactive Ion Etching (RIE), or Electron Cyclotron Resonance (ECR).

Figure 9:
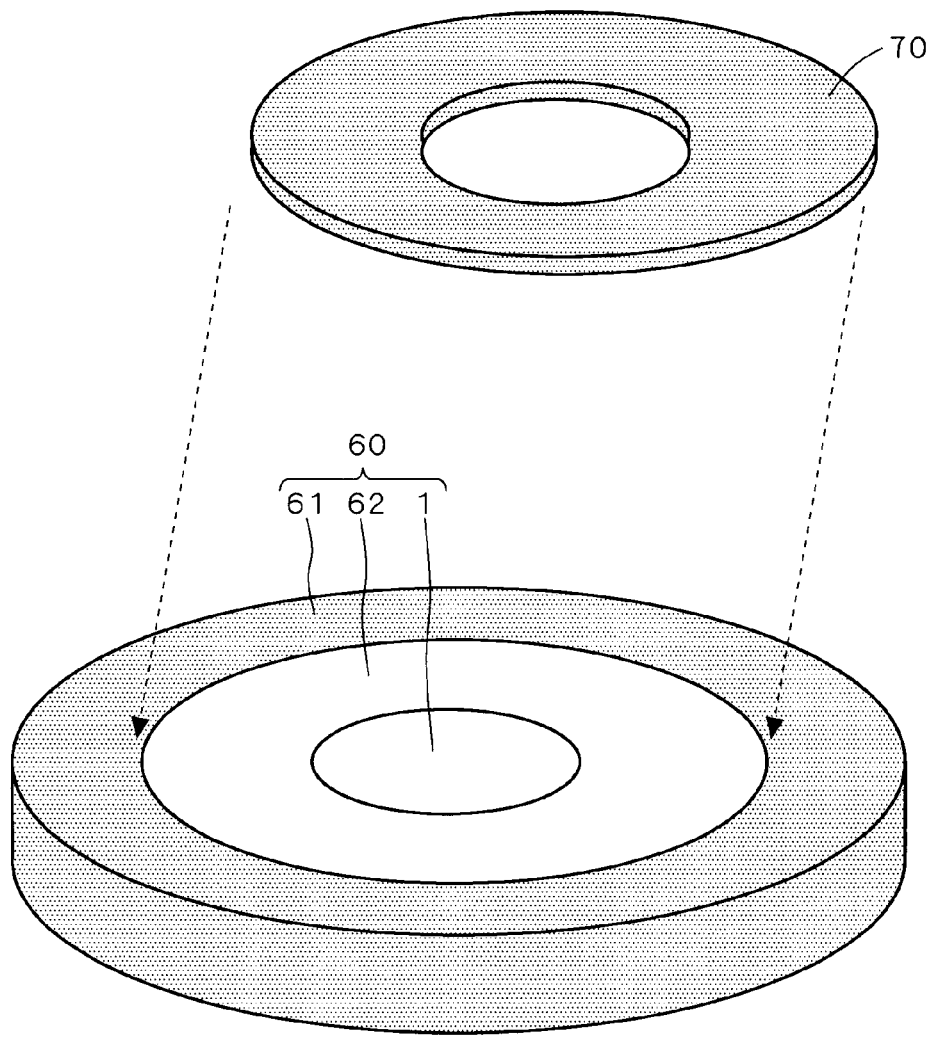

The etching uses a chlorine-based gas that contains chlorine (Cl). In this preferred embodiment, a Si-containing plasma is mixed in addition to the chlorine-based gas. For this process, a certain amount of gas of, e.g., $SiCl_4$, is mixed in a chlorine-based gas, for example. Also, in general, the GaN substrate 1 is often formed as one structure with a Si substrate and/or a sapphire substrate. In such a case, the sapphire substrate may be covered with another Si substrate so that all the exposed area, except that of the GaN substrate 1, is formed of the Si substrates, and then the Si is etched to generate a chemical species in the form of SiClx. In the schematic diagram of FIG. 9, the substrate 60 is formed as one piece of a Si substrate 61, a sapphire substrate 62 (a second material), and the GaN substrate 1, and the sapphire substrate 62 is covered by a Si substrate 70 so that all the exposed area except that of the GaN substrate 1 is formed of the Si substrates. When the substrate 60 is formed only of the sapphire substrate 62 and the GaN substrate 1, the etching is performed with the sapphire substrate 62 similarly covered by the Si substrate 70. Also, when the substrate 60 is made only of the Si substrate 61 and the GaN substrate 1, the etching is performed with no cover.

Figure 5:
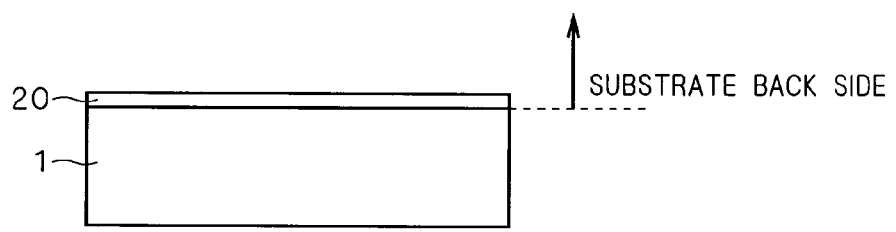

The back surface of the GaN substrate 1 is made to react with Si-containing plasma, whereby GaN and Si react with each other to form the surface denatured layer 20 as shown in FIG. 5. As mentioned earlier, in contrast with the relatively deep doped layer 21 of FIG. 3, the surface denatured layer 20 is formed in a limited region including the outermost surface or one or two layers of the GaN substrate 1. It is therefore necessary to achieve the polishing process only with mechanical polishing so that the surface roughness radius "Ra" is large and the back surface area of the GaN substrate 1 is thus large. Specifically, a surface roughness Ra≈2.5 nm is obtained when a dry-etching of about 2 μm is performed after the mechanical polishing. Low-resistance ohmic properties and high adhesion as described later can be realized when the surface roughness Ra is about 2 nm or more.

After the Si-containing plasma treatment, an oxygen plasma treatment is performed with an oxygen asher. It is then possible to partially oxidize the surface denatured layer 20 and to introduce defects into the back layer of the GaN substrate 1 to increase the carrier concentration in a pseudo manner.

Performing the oxygen plasma treatment in addition further lowers the resistance value to approximately half, as compared with performing the Si-containing plasma treatment only. This also enhances the adhesion with the n-electrode 10.

Figure 6:
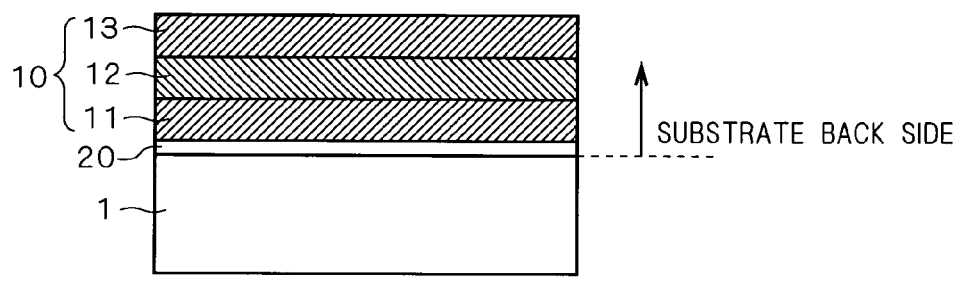

Next, the Ti film 11, the Pt film 12, and the Au film 13, for forming the n-electrode 10, are sequentially deposited over the back surface of the GaN substrate 1 by, e.g., Electron Beam (EB) evaporation (FIG. 6). The n-electrode 10 having the three-layered structure of Ti/Pt/Au is thus formed. The film thickness of the Ti film 11 can be about 10 to 100 nm. The Pt film 12 is formed to such a thickness as to obtain a barrier effect to prevent the reaction between the Ti film 11 and the Au film 13 in following thermal treatment, specifically to a thickness of about 50 to 100 nm. The Au film 13 requires such a film thickness that it will not be removed due to the reaction with solder during the device assembly process, and specifically a film thickness of about 200 nm or more is enough, for example. The structure of the n-electrode 10 is not limited to the three-layered structure of Ti/Pt/Au, but the same effects can be obtained with a two-layered structure of Ti/Al, for example (where the Ti film 11 is placed in contact with the surface denatured layer 20). Also, the material is not limited to Ti, but the n-electrode 10 offers good adhesion when a metal layer at least containing any of Ti, Al, Ta, Zr and Mo, which are highly reactive with N and O, is placed in contact with the surface denatured layer 20.

Figure 7:
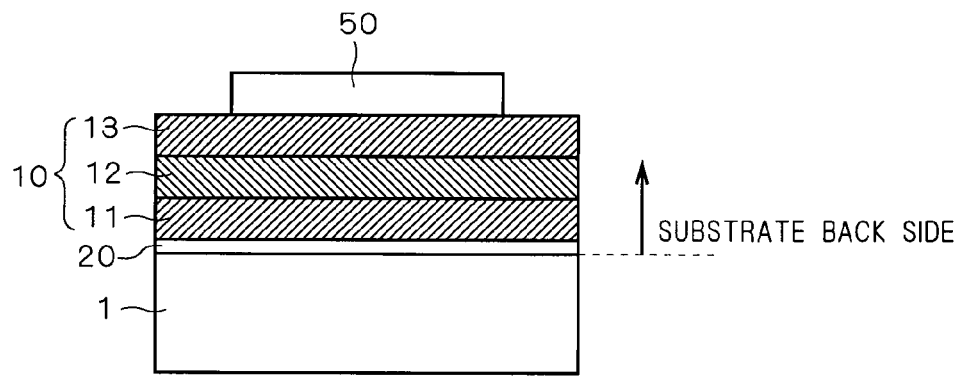
Figure 8:
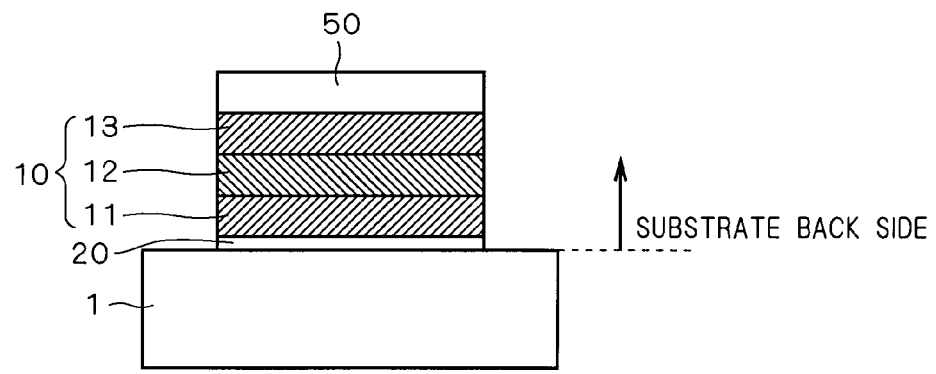

Next, the n-electrode 10 is patterned as needed. That is, as shown in FIG. 7, a predetermined pattern of resist mask 50 is formed on the n-electrode 10, and unwanted part of the n-electrode 10 is removed by using the mask, e.g., by wet-etching or ion-milling (FIG. 8). The resist mask 50 is then removed.

The process illustrated above patterns the n-electrode 10 by forming the resist mask 50 after the deposition of material and then performing wet-etching or ion-milling, but the n-electrode 10 may be patterned by previously forming a given pattern of resist prior to the deposition of material and then peeling it after the deposition (lift-off). However, when the lift-off procedure is adopted, the chemical may act on the surface of the surface denatured layer 20 before the deposition and damage the surface denatured layer 20. Accordingly, wet-etching and ion-milling are preferable to lift-off. In particular, ion-milling is capable of certainly removing Pt which is difficult to remove (pattern) by etching.

A thermal treatment is performed after the formation of the n-electrode 10. It is possible to enhance the thermal stability by performing this thermal treatment at a temperature not lower than the temperature (about 360° C.) used during the device assembly process after the device formation. It is also possible to obtain lower resistance by setting the temperature not higher than the temperature (400° C.) at which the resistance value starts varying. That is, performing the thermal treatment at 360° C. to 400° C. allows stably obtaining lower resistance. This thermal treatment can be omitted when thermal treatment performed in the assembly process suffices.

The n-electrode structure of this preferred embodiment is thus formed on the back surface of the GaN substrate 1 through the process steps described above.

Figure 10:
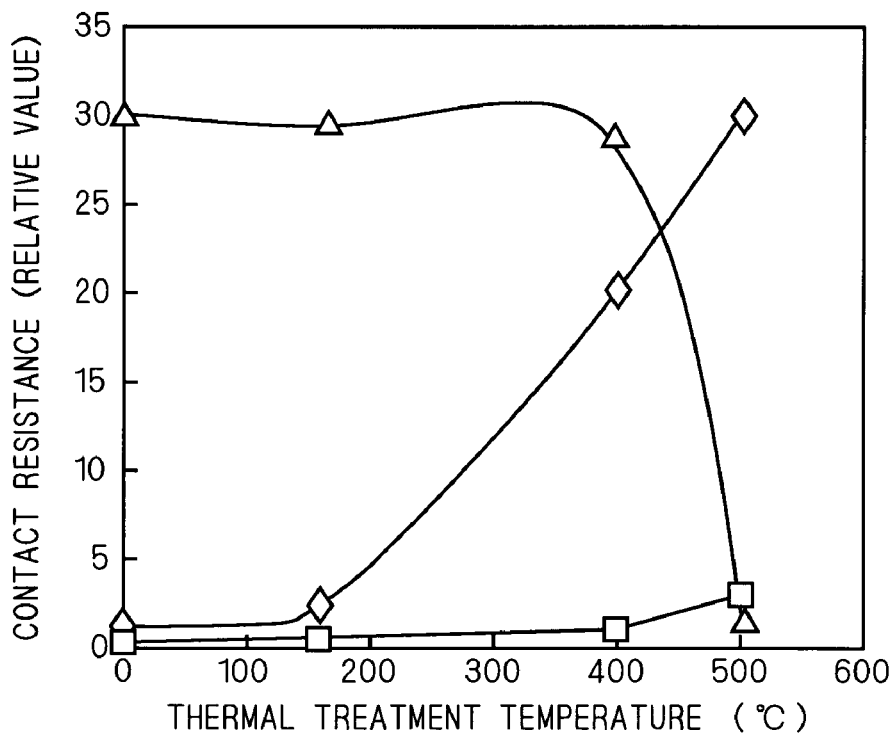
FIG. 10 is a graph used to describe an effect of the first preferred embodiment.

FIG. 10 is a graph used to describe an effect of the first preferred embodiment, which shows a relation between the temperature of the thermal treatment performed after the formation of the n-electrode of the nitride semiconductor device and the contact resistance between the n-type GaN substrate and the n-electrode. The graph shows a comparison between conventionally structured devices (shown with ∆ and ◇, and not having the surface denatured layer 20 between the GaN substrate 1 and the n-electrode 10 of FIG. 1) and the device of the first preferred embodiment (shown with □). The n-electrode was made as a three-layered structure of Ti/Pt/Au in all devices. The values of contact resistance shown on the vertical axis in the graph are relative values that are obtained assuming that a conventional structure exhibits a contact resistance of "1" when not subjected to thermal treatment.

As shown in FIG. 10, the conventional nitride semiconductor device shown with ∆ exhibits high resistance immediately after the formation of the n-electrode 10, and the resistance is lowered only through the application of high-temperature thermal treatment. The conventional nitride semiconductor device shown with ◇ offers low resistance immediately after the formation of the n-electrode 10, but the resistance value increases at thermal treatment temperatures around 350° C. that are required for device assembly.

In contrast, the nitride semiconductor device of the preferred embodiment shown with □ offers low resistance immediately after the formation of the n-electrode 10, and the resistance value stays steady almost without rising even at thermal treatment temperatures around 400° C. That is, placing the n-electrode not in direct contact with the GaN substrate 1 but with the surface denatured layer 20 sandwiched therebetween makes it possible to stably obtain low resistance.

That is, according to this preferred embodiment, it is possible to stably maintain small contact resistance even when thermal treatment is performed after the formation of the n-electrode 10. The contact resistance of the n-electrode 10 is thus not increased even through temperature variations in the device assembly process. That is, the contact resistance between the GaN substrate 1 and the n-electrode 10 is kept small even after the completion of device assembly. It is thus possible to reduce the operating voltage of the nitride semiconductor device and to lessen influences of heat generation, which provides stable operating output and enables higher-power output.

Also, the adhesion of the n-electrode 10 as a metal electrode is enhanced because the surface denatured layer 20 offering good adhesion enhanced by the plasma treatment is sandwiched between the n-electrode 10 and the back surface of the GaN substrate 1.

In this way, the nitride semiconductor device and the manufacturing method according to this preferred embodiment achieve low-resistance ohmic properties and high adhesion. This allows the manufacture of high-performance laser diodes at lower costs.

Second Preferred Embodiment

While the first preferred embodiment has described a structure in which the surface denatured layer 20 is interposed between the Ti film 11 and the GaN substrate 1 as shown in FIG. 2, a barrier layer may be further interposed between the Ti film 11 and the surface denatured layer 20.

Figure 11:
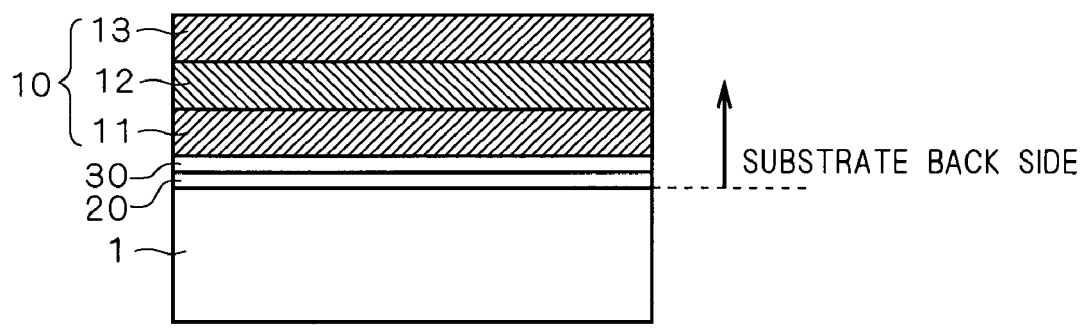
FIG. 11 is an enlarged cross-sectional view illustrating the back surface side of the substrate of a nitride semiconductor device according to a second preferred embodiment.

FIG. 11 is an enlarged cross-sectional view showing the back surface side of the GaN substrate 1 of a nitride semiconductor device according to a second preferred embodiment. In FIG. 11, a barrier layer 30 for preventing the reaction between the n-electrode 10 and the surface denatured layer 20 is sandwiched between the n-electrode 10 (the Ti film 11) and the surface denatured layer 20 of FIG. 2.

The barrier layer 30 may be formed by applying a solution containing constituent material of the barrier layer 30 onto the GaN substrate 1, or by exposing it in an atmosphere containing constituent material of the barrier layer 30. The material of the barrier layer 30 can be organic-silicon-based material, and specific examples thereof include hexamethyldisilazane (HMDS), siloxane-based materials and TEOS-based materials.

According to this preferred embodiment, the presence of the barrier layer 30 (and the surface denatured layer 20) between the n-electrode 10 and the back surface of the GaN substrate 1 prevents the reaction between the n-electrode 10 and the GaN substrate 1 during thermal treatment. This prevents reduction of carrier concentration in the back layer of the GaN substrate 1 that would be caused by the reaction, and prevents increase of barrier height (reduction of tunneling) between the GaN substrate 1 and the n-electrode 10. Thus, even when thermal treatment is performed, it is possible to stably keep small the contact resistance between the n-electrode 10 and the GaN substrate 1.

In this way, the nitride semiconductor device and the manufacturing method according to this preferred embodiment achieve still-lower-resistance ohmic properties, in addition to the effects of the first preferred embodiment.

When the device has the barrier layer 30, a thermal treatment suitable for the thickness of the barrier layer 30 may be performed after the deposition of material of the n-electrode 10 so that the barrier layer 30 reacts with the Ti film 11. This reduces the resistance of the barrier layer 30.

While the invention has been described in detail, the foregoing description is in all aspects illustrative and not restrictive. It is understood that numerous other modifications and variations can be devised without departing from the scope of the invention.

What is claimed is:

1. A nitride semiconductor device comprising:
   a nitride semiconductor substrate;
   a layered-structure of a nitride semiconductor element that is provided on a first main surface side of said nitride semiconductor substrate;
   a metal electrode provided on a second main surface side of said nitride semiconductor substrate; and
   a surface denatured layer that contains Si and is provided between said nitride semiconductor substrate and said metal electrode, said surface denatured layer being formed by denaturing the second main surface of said nitride semiconductor substrate by causing the second main surface to react with a first material that contains Si.

2. The nitride semiconductor device according to claim 1, wherein said surface denatured layer is further made to react with oxygen and thus contains oxygen.

3. The nitride semiconductor device according to claim 1, further comprising a barrier layer provided between said metal electrode and said surface denatured layer.

4. The nitride semiconductor device according to claim 1, wherein said metal electrode comprises a metal layer that at least contains any of Ti, Al, Ta, Zr and Mo in contact with said surface denatured layer.

5. The nitride semiconductor device according to claim 4, wherein said metal electrode comprises a Ti layer, a Pt layer, and an Au layer stacked in this order.

6. A nitride semiconductor device manufacturing method comprising:
   a step of forming a layered-structure of a nitride semiconductor element on a first main surface of a nitride semiconductor substrate;
   a denatured layer forming step of forming a surface denatured layer that contains Si on a second main surface of said nitride semiconductor substrate by denaturing the second main surface of said nitride semiconductor substrate by causing the second main surface to react with a first material that contains Si;
   an electrode forming step of forming a metal electrode on said surface denatured layer; and
   a step of producing the nitride semiconductor device of claim 1.

7. The nitride semiconductor device manufacturing method according to claim 6, further comprising a thermal treatment step of performing a thermal treatment after said electrode forming step.

8. The nitride semiconductor device manufacturing method according to claim 6, wherein said denatured layer forming step comprises:
   a grinding and polishing step of applying grinding and polishing to the second main surface of said nitride semiconductor substrate;
   a plasma treatment step of, after said grinding and polishing step, applying a surface treatment to the second main surface of said nitride semiconductor substrate with a plasma that contains said first material; and
   an oxygen plasma treatment step of, after said plasma treatment step, applying a surface treatment to the second main surface of said nitride semiconductor substrate with a plasma that contains oxygen.

9. The nitride semiconductor device manufacturing method according to claim 8, wherein
   said grinding and polishing step comprises a mechanical polishing step of performing a mechanical polishing using a diamond slurry, and
   said plasma treatment step is performed following said mechanical polishing step.

10. The nitride semiconductor device manufacturing method according to claim 9, wherein said diamond slurry has a particle size of 0.4 μm or more and a pH of 8.5 or less.

11. The nitride semiconductor device manufacturing method according to claim 8, wherein
   said nitride semiconductor substrate is formed as one piece with a second material other than nitride semiconductors, and
   said plasma treatment step applies said surface treatment with a chlorine-based gas contained in said plasma, with said second material covered by silicon.

12. The nitride semiconductor device manufacturing method according to claim 8, wherein said plasma treatment step is performed such that the second main surface of said nitride semiconductor substrate has a roughness of 2 nm or more.

13. The nitride semiconductor device manufacturing method according to claim 8, wherein said electrode forming step comprises a step of applying an ion milling to deposited metal by using a predetermined pattern of resist as a mask.

14. The nitride semiconductor device manufacturing method according to claim 7, wherein said thermal treatment step performs the thermal treatment in a temperature range of not less than 360° C. nor more than 400° C.

15. The nitride semiconductor device according to claim 1, wherein the layered-structure of a nitride semiconductor element comprises a n-type nitride semiconductor layer and a p-type nitride semiconductor layer.

16. The nitride semiconductor device according to claim 15, wherein
the n-type nitride semiconductor layer is a n-type nitride semiconductor cladding layer;
the p-type nitride semiconductor layer is a p-type nitride semiconductor cladding layer; and
the nitride semiconductor device further comprises, between the n-type nitride semiconductor cladding layer and the p-type nitride semiconductor cladding layer, a n-type nitride semiconductor guide layer and a p-type nitride semiconductor guide layer.

17. The nitride semiconductor device according to claim 16, wherein
the n-type nitride semiconductor cladding layer comprises AlGaN;
the n-type nitride semiconductor guide layer comprises CaN;
the p-type nitride semiconductor guide layer comprises CaN; and
the p-type nitride semiconductor cladding layer comprises AlGaN.

* * * * *